US010958256B1

United States Patent
Lin

(10) Patent No.: US 10,958,256 B1
(45) Date of Patent: Mar. 23, 2021

(54) FIFTY PERCENT DUTY CYCLE DETECTOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/067,832

(22) Filed: Oct. 12, 2020

(51) Int. Cl.
*H03K 5/15* (2006.01)
*H03K 5/156* (2006.01)
*G06F 9/448* (2018.01)
*G04F 10/00* (2006.01)
*H03K 5/05* (2006.01)

(52) U.S. Cl.
CPC ....... *H03K 5/15066* (2013.01); *G04F 10/005* (2013.01); *G06F 9/4498* (2018.02); *H03K 5/05* (2013.01); *H03K 5/1565* (2013.01)

(58) Field of Classification Search
CPC .... H03K 5/15066; H03K 5/05; H03K 5/1565; G06F 9/4498; G04F 10/005
USPC .......................................................... 327/291
See application file for complete search history.

(56) References Cited

U.S. PATENT DOCUMENTS

| | | | | |
|---|---|---|---|---|
| 6,552,578 B1 * | 4/2003 | Cheung | ................ | G06F 1/3203 327/26 |
| 7,403,055 B2 * | 7/2008 | Minzoni | .............. | G11C 7/1066 327/172 |
| 7,705,648 B1 * | 4/2010 | Fung | ........................ | H03K 5/19 327/175 |
| 2006/0152266 A1 * | 7/2006 | Han | ........................ | G11C 7/222 327/175 |
| 2013/0229216 A1 * | 9/2013 | Wu | ........................ | H03K 5/1565 327/175 |
| 2015/0295564 A1 * | 10/2015 | Jones, Jr. | .............. | H03K 3/017 327/175 |

* cited by examiner

*Primary Examiner* — Tomi Skibinski
(74) *Attorney, Agent, or Firm* — McClure, Qualey & Rodack, LLP

(57) ABSTRACT

A fifty percent duty cycle detector includes a single-ended-to-differential converter (S2D) configured to receive a first clock and output a second clock and a third clock that are complementary; a controllable swap circuit configured to receive the second clock and the third clock and output a fourth clock and a fifth clock in accordance with a logical control signal; a time-to-digital converter (TDC) configured to receive the fourth clock and the fifth clock and output a digital word; and a finite state machine configured to receive the digital word and output the logical control signal and a ternary decision.

7 Claims, 4 Drawing Sheets

US 10,958,256 B1

FIFTY PERCENT DUTY CYCLE DETECTOR AND METHOD THEREOF

BACKGROUND OF THE DISCLOSURE

Field of the Disclosure

The present disclosure generally relates to fifty percent duty cycle detection and more particularly to a fast fifty percent duty cycle detection circuit that is area efficient, and method thereof.

Description of Related Art

Many modern electronic circuits require a precise clock for proper operation. A clock is a voltage signal that periodically toggles back and forth between a low level and a high level. A percentage of time that the voltage signal stays in the high level (with respect to the total high-low time) is called a duty cycle. Many circuits require a specific duty cycle for a clock to provide an optimal performance. In a multi-phase clock system wherein both a rising edge and a falling edge of a clock are used, a 50% duty cycle is frequently desired. To ensure that a clock has a 50% duty cycle, a duty-cycle correction circuit is needed. A duty-cycle correction circuit, however, needs to first detect whether the duty cycle of the clock is smaller than or greater than 50%, and then make correction accordingly. That is, a 50% duty cycle detector is needed.

As depicted in FIG. 1, a conventional 50% duty cycle detector 100 comprises: an inverter 110 configured to receive a first clock $C_x$ and output a second clock $C_y$; a first low-pass filter (LPF) 120 configured to receive the first clock $C_x$ and output a first mean voltage $V_x$; a second LPF 130 configured to receive the second clock $C_y$ and output a second mean voltage $V_y$; and a comparator 140 configured to output a decision $D_x$ in accordance with a comparison between the first mean voltage $V_x$ and the second mean voltage $V_y$. The second clock $C_y$ is a logical inversion of the first clock $C_x$, and therefore a duty cycle of the second clock $C_y$ is equal to one hundred percent minus a duty cycle of the first clock $C_x$. For instance, if the duty cycle of the first clock $C_x$ is 45%, the duty cycle of the second clock $C_y$ will be 55%. The first mean voltage $V_x$ is proportional to the duty cycle of the first clock $C_x$, while the second mean voltage $V_y$ is proportional to the duty cycle of the second clock $C_y$. If the decision $D_x$ is 1 (0), it indicates the first mean voltage $V_x$ is higher than the second mean voltage $V_y$, and implies the duty cycle of the first clock $C_x$ is greater (smaller) than 50%. A drawback of the 50% duty cycle detector 100 is: LPF 120 (130) must have a very low cut-off frequency to fulfill an effective averaging function so that $V_x$ ($V_y$) can be a steady value that can accurately represent the duty cycle of the first (second) clock $C_x$ ($C_y$). A low-pass filter usually comprises a resistor and a capacitor and has a low-pass cut-off corner determined by a product of the resistance of the resistor and a capacitance of the capacitor. A low-pass filter with a very low cut-off frequency usually requires using a large capacitor, otherwise the low-pass filter itself might be too noisy. Besides, a long time is needed for $V_x$ ($V_y$) to reach the steady value. For instance, in a typical design, for a 40 MHz clock, a cut-off frequency of approximately 10 KHz is needed, a 10 pF capacitor is needed, and a settling time needed to reach the steady state is approximately 100 μs. When integrated and fabricated on a silicon substrate using a CMOS (complementary metal oxide semiconductor process), the layout area of a large capacitor is large.

What is desired is a fifty percent duty cycle detector that is fast and layout area efficient.

BRIEF DESCRIPTION OF THIS DISCLOSURE

In an embodiment, a fifty percent duty cycle detector comprises: a single-ended-to-differential converter (S2D) configured to receive a first clock and output a second clock and a third clock that are complementary; a controllable swap circuit configured to receive the second clock and the third clock and output a fourth clock and a fifth clock in accordance with a logical control signal; a time-to-digital converter (TDC) configured to receive the fourth clock and the fifth clock and output a digital word; and a finite state machine configured to receive the digital word and output the logical control signal and a ternary decision.

In an embodiment, a method of 50% duty cycle detection comprises: receiving a first clock; converting the first clock into a second clock and a third clock using a single-ended-to-differential converter (S2D); assigning the second clock and the third clock to be a fourth clock and a fifth clock, respectively, and obtaining a first digital word by performing a first time-to-digital conversion that detects a timing difference between the fourth clock and the fifth clock; assigning the third clock and the second clock to be the fourth clock and the fifth clock, respectively, and obtaining a second digital word by performing a second time-to-digital conversion that detects a timing difference between the fourth clock and the fifth clock; and making a ternary decision based on comparing the first digital word and the second digital word.

DETAILED DESCRIPTION OF THIS DISCLOSURE

Figure 1:
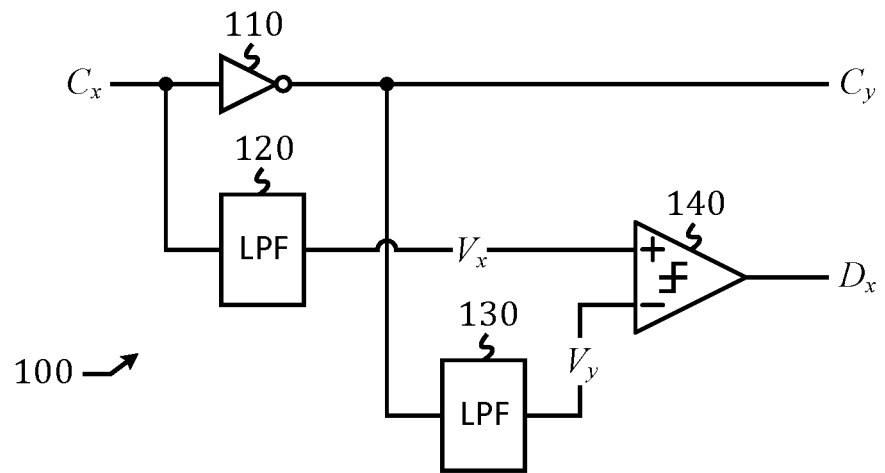
FIG. 1 shows a schematic diagram of a prior art 50% duty cycle detector.

The present disclosure is directed to fifty percent duty cycle detection. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "single-ended," "differential," "finite state machine," "CMOS (complementary metal oxide semiconductor)," "NMOS (n-channel metal oxide semiconductor)," "inverter," "logic gates," "flip-flops," "digital circuit," "switch," "low-pass filter," and "duty cycle." Terms like these are used in a context of microelectronics, and the associated concepts are apparent to those of ordinary skills in the art and thus will not be explained in detail here.

Those of ordinary skill in the art will recognize basic symbols used herein, like a switch symbol and an inverter symbol. As well, artisans will understand the structure and operations of such devices.

This present disclosure is disclosed in terms of an engineering sense (i.e., in a manner that recognizes that engineers are the target audience). For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

In this present disclosure, a signal is a voltage of a variable level that can vary with time, or a digit with a value that can vary with time. When a signal is a voltage, it is called a voltage signal and a level of the signal at a moment represents a state of the signal at that moment. When a signal is a digital, it is called a digital signal, and a value of the signal at a moment represents a state of the signal at that moment.

A logical signal is a voltage signal of two states: a low state and a high state. The low state is also referred to as a "0" state, while the high stage is also referred to as a "1" state. Regarding a logical signal Q, when we say, "Q is high" or "Q is low," what we mean is "Q is in the high state" or "Q is in the low state." Likewise, when we say, "Q is 1" or "Q is 0," what we mean is "Q is in the 1 state" or "Q is in the 0 state."

A ternary signal is a voltage signal of three states: a "−1" state, a "0" state, and a "1" state.

When a logical signal toggles from low to high, it undergoes a low-to-high transition and exhibits a rising edge. When a logical signal toggles from high to low, it undergoes a high-to-low transition and exhibits a falling edge.

A switch is controlled by a logical control signal, and the switch is approximately a short circuit and is said to be turned on when said logical control signal is high (i.e. 1); and said switch is approximately an open circuit and said to be turned off when said logical control signal is low (i.e. 0).

A first logical signal is said to be a logical inversion of a second logical signal, if the first logical signal and the second logical signal are always in opposite states. That is, when the first logical signal is low (i.e. 0), the second logical signal is high (i.e. 1); when the first logical signal is high (i.e. 1), the second logical signal is low (i.e. 0). When a first logical signal is said to be a logical inversion of a second logical signal, the first logical signal and the second logical signal are said to be complementary to each other.

An inverter receives a first logical signal and outputs a second logical signal such that the second logical signal is a logical inversion of the first signal.

A digital word is a digital signal of an integer value that can be embodied by a collection of a plurality of logical signals in accordance with a certain encoding scheme.

A circuit is a collection of a transistor, a resistor, and/or other electronic devices inter-connected in a certain manner to embody a certain function.

Figure 2:
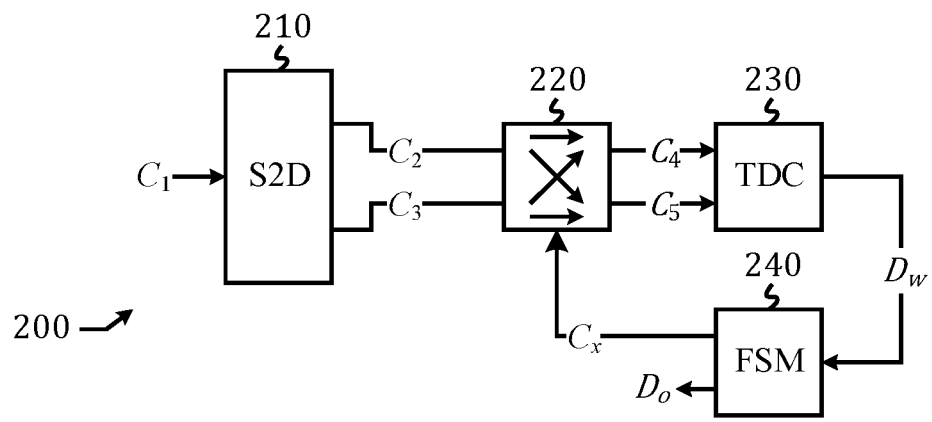
FIG. 2 shows a schematic diagram of a 50% duty cycle detector in accordance with an embodiment of the present disclosure.

A schematic diagram of a 50% duty cycle detector 200 in accordance with an embodiment of the present disclosure is shown in FIG. 2. 50% duty cycle detector 200 comprises: a single-ended-to-differential converter (S2D) 210 configured to receive a first clock $C_1$ and output a second clock $C_2$ and a third clock $C_3$, wherein the second clock $C_2$ and the third clock $C_3$ are complementary; a controllable swap circuit 220 configured to receive the second clock $C_2$ and the third clock $C_3$ and output a fourth clock $C_4$ and a fifth clock $C_5$ in accordance with a logical control signal $C_x$; a time-to-digital converter (TDC) 230 configured to receive the fourth clock $C_4$ and the fifth clock $C_5$ and output a digital word $D_w$ that quantifies a timing difference between a rising edge of the fourth clock $C_4$ and a subsequent rising edge of the fifth clock $C_5$; and a finite state machine (FSM) 240 configured to receive the digital word $D_w$ and output the logical control signal $C_x$ and a ternary decision $D_o$ indicating a duty cycle of the first clock $C_1$ is smaller than 50%, or equal to 50%, or greater than 50%. For brevity, hereafter the first (second, third, fourth, fifth) clock $C_1$ ($C_2$, $C_3$, $C_4$, $C_5$) is simply referred to as $C_1$ ($C_2$, $C_3$, $C_4$, $C_5$); the digital word $D_w$ is simply referred to as $D_w$; the logical control signal $C_x$ is simply referred to as $C_x$; and the ternary decision $D_o$ is simply referred to as $D_o$.

Figure 3:
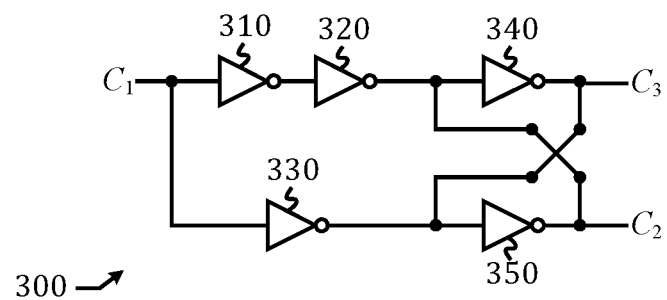
FIG. 3 shows a schematic diagram of a single-ended-to-differential converter.

A schematic diagram of a single-ended-to-differential converter (S2D) 300 that can be used to embody the S2D 210 is shown in FIG. 3. S2D 300 comprises inverters 310, 320, 330, 340, and 350. Inverters 310 and 320 are cascaded to form a non-inverting buffer configured to receive $C_1$ and output $C_2$ so that $C_2$ is substantially the same as $C_1$. Inverter 330 forms an inverting buffer so that $C_3$ is substantially a logical inversion of $C_1$. Inverters 340 and 350 form a cross-coupling pair to ensure $C_2$ and $C_3$ are a logical inversion of each other. S2D 300 is well known in the prior art and thus no further explanation is needed. Since $C_2$ is substantially the same as $C_1$, a duty cycle of $C_2$ is substantially the same as a duty cycle of $C_1$. Hence, detecting a duty cycle of $C_2$ is substantially equivalent to detecting a duty cycle of $C_1$. From an engineering viewpoint, $C_2$ can be said to be the same as $C_1$, while $C_3$ can be said to be the same as a logical inversion of $C_1$.

Figure 4:
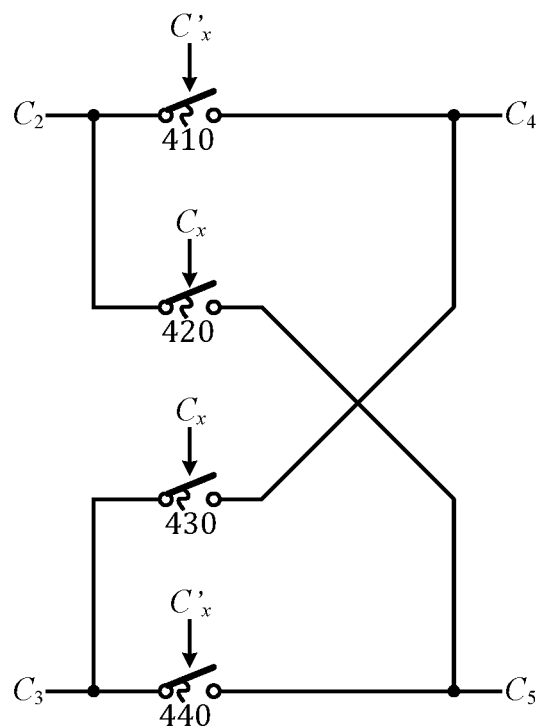
FIG. 4 shows a schematic diagram of a controllable swap circuit.

A schematic diagram of a controllable swap circuit 400 that can be used to embody the controllable swap circuit 220 is shown in FIG. 4. Controllable swap circuit 400 comprises four switches 410, 420, 430, and 440 controlled by $C'_x$, $C_x$, $C_x$, and $C'_x$, respectively, wherein $C'_x$ is a logical inversion of $C_x$. When $C_x$ is 0 and thus $C'_x$ is 1, switches 410 and 440 are turned on while switches 420 and 430 are turned off, causing $C_4$ to be equal to $C_2$ and $C_5$ to be equal to $C_3$; this is a straight connection scenario and no swapping takes place. When $C_x$ is 1 and thus $C'_x$ is 0, switches 410 and 440 are turned off while switches 420 and 430 are turned on, causing $C_4$ to be equal to $C_3$ and $C_5$ to be equal to $C_2$; this is a cross connection scenario and a swapping takes place. A controllable swap function is thus fulfilled.

Figure 5:
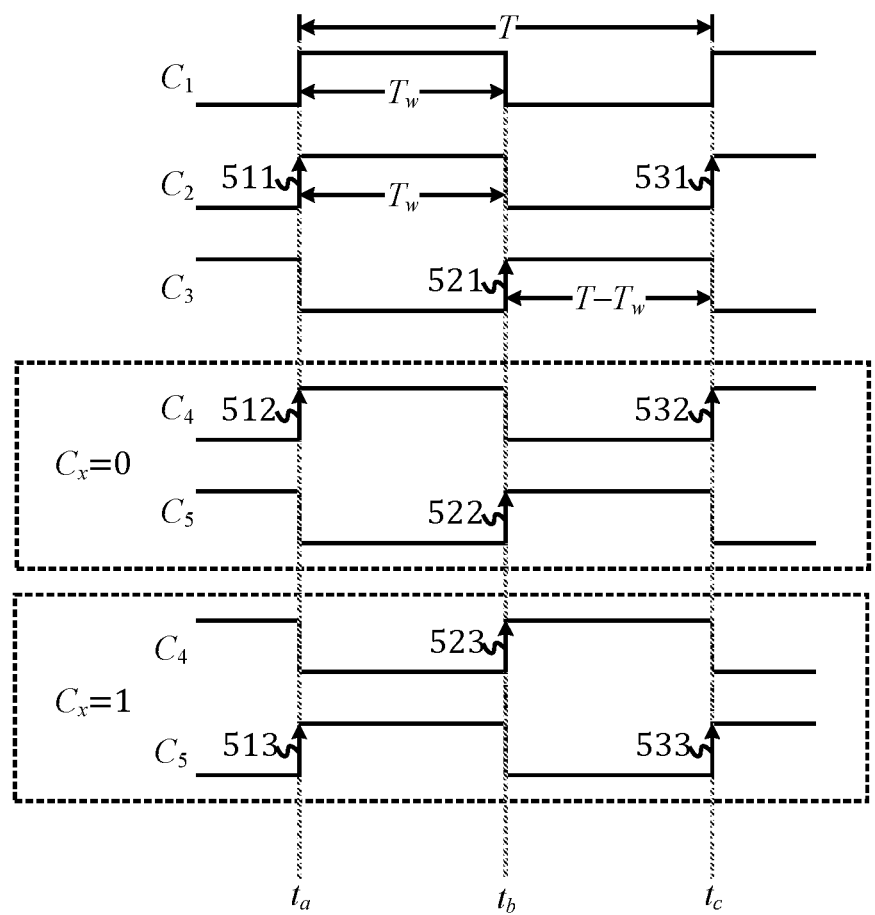
FIG. 5 shows an exemplary timing diagram of the 50% duty cycle detector of FIG. 2.

An exemplary timing diagram of the 50% duty cycle detector 200 is shown in FIG. 5. Let a period of $C_1$ be T. Let a pulse width of $C_1$ be $T_w$. $C_2$ is the same as $C_1$, $C_3$ is a logical inversion of $C_2$, and thus both $C_2$ and $C_3$ have the same period T. A pulse width of $C_2$ is $T_w$, while a pulse width of $C_3$ is $T-T_w$. A duty cycle of $C_2$ is $T_w/T \times 100\%$. A duty cycle of $C_3$ is $(1-T_w/T) \times 100\%$. When $C_x$ is 0, rising edge 511 of $C_2$ leads to rising edge 512 of $C_4$ at time $t_a$, rising edge 521 of $C_3$ leads to rising edge 522 of $C_5$ at time $t_b$, and rising edge 531 of $C_2$ leads to rising edge 532 of $C_4$ at time $t_c$. When $C_x$ is 1, rising edge 511 of $C_2$ leads to rising edge 513 of $C_5$ at time $t_a$, rising edge 521 of $C_3$ leads to rising edge 523 of $C_4$ at time $t_b$, and rising edge 531 of $C_2$ leads to rising edge 533 of $C_5$ at time $t_c$.

TDC 230 detects a timing difference between a rising edge of $C_4$ and a subsequent rising edge of $C_5$ (i.e. a distance between $t_a$ and $t_b$ when $C_x$ is 0, and a distance between $t_b$ and $t_c$ when $C_x$ is 1) and represents the timing difference by $D_w$; a larger value of $D_w$ indicates a greater timing difference between the rising edge of $C_4$ and the subsequent rising edge of $C_5$. When $C_x$ is 0, $C_4$ is the same as $C_2$ and $C_5$ is the same as $C_3$; in this case, $D_w$ has a first value, say $D_{w0}$, that effectively represents $T_w$, i.e. a timing difference between a rising edge of $C_2$ and a subsequent rising edge of $C_3$; for instance, a timing difference between rising edge 511 of $C_2$ and rising edge 521 of $C_3$. When $C_x$ is 1, $C_4$ is the same as $C_3$ and $C_5$ is the same as $C_2$; in this case, $D_w$ has a second value, say $D_{w1}$, that effectively represents $T-T_w$, i.e. a timing difference between a rising edge of $C_3$ and a subsequent rising edge of $C_2$; for instance, a timing difference between rising edge 521 of $C_3$ and rising edge 531 of $C_2$. When $D_{w0}$ is greater (smaller) than $D_{w1}$, it indicates $T_w$ is greater (smaller) than $T-T_w$, and therefore a duty cycle of $C_2$ is greater (smaller) than 50%. When $D_{w0}$ is equal to $D_{w1}$, it indicates $C_2$ has a 50% duty cycle.

FSM 240 first sets $C_x$ to 0 and obtains $D_{w0}$; then it sets $C_x$ to 1 and obtains $D_{w1}$; then it determines a value of $D_o$ in accordance with a comparison between $D_{w0}$ and $D_{w1}$: $D_o$ is −1 if $D_{w0}$ is smaller than $D_{w1}$; $D_o$ is 0 if $D_{w0}$ is equal to $D_{w1}$; and $D_o$ is 1 if $D_{w0}$ is greater than $D_{w1}$.

Time-to-digital converters are well known in the prior art and thus not described in detail here. Any time-to-digital converter circuit known in the prior art can be used to embody TDC 230 at the discretion of circuit designer. A distinct feature of using TDC 230 in the 50% duty cycle detector 200 is: as long as TDC 230 is monotonic (i.e., a larger time difference between a rising edge of $C_4$ and a subsequent rising edge of $C_5$ will lead to a larger value or at least the same value of $D_w$), a linearity of TDC 230 is unimportant because whatever impairment due to nonlinearity will affect both the value of $D_{w0}$ and the value of $D_{w1}$, and the impairment will be offset since we're interested only in the relative difference between $D_{w0}$ and $D_{w1}$. Many known TDC are directed to achieving a high linearity at the cost of large layout area and power consumption. The 50% duty cycle detector 200 doesn't have high linearity requirement for TDC 230, and therefore it can allow an efficient design. In an embodiment, TDC 230 is an all-digital TDC that comprises a plurality of inverters, logic gates, and flip-flops that are purely digital circuits. All-digital TDC is known in the prior art and thus not described in detail here.

The 50% duty cycle detector 200 needs to take only six cycles of $C_1$ (one cycle to set $C_x$ to 0, two cycle to obtain $D_{w0}$, one cycle to set $C_x$ to 1, and two cycles to obtain $D_{w1}$) to obtain a value of $D_o$, therefore it is very fast. For instance, if $C_1$ is a 40 MHz clock, a clock period is 25 ns, it takes merely 150 ns to obtain $D_o$.

The 50% duty cycle detector 200 can be an all-digital circuit design that uses logic gates exclusively and is highly area efficient using a modern complementary metal oxide semiconductor (CMOS) process.

Figure 6:
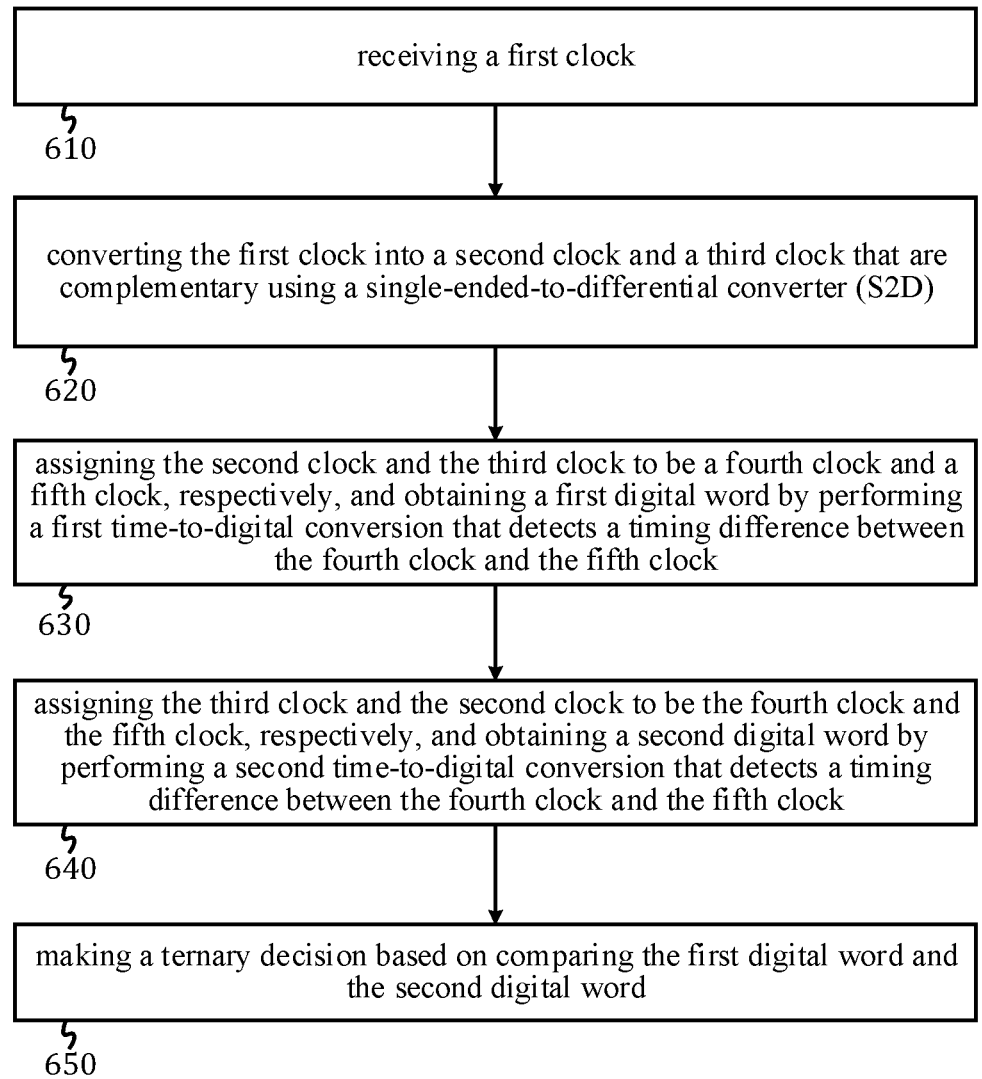
FIG. 6 shows a flow diagram of a method of frequency doubling in accordance with an embodiment of the present disclosure.

As demonstrated by a flow chart 600 shown in FIG. 6, a method of 50% duty cycle detection in accordance with an embodiment of the present disclosure comprises: (step 610) receiving a first clock; (step 620) converting the first clock into a second clock and a third clock that are complementary using a single-ended-to-differential converter (S2D); (step 630) assigning the second clock and the third clock to be a fourth clock and a fifth clock, respectively, and obtaining a first digital word by performing a first time-to-digital conversion that detects a timing difference between the fourth clock and the fifth clock; (step 640) assigning the third clock and the second clock to be the fourth clock and the fifth clock, respectively, and obtaining a second digital word by performing a second time-to-digital conversion that detects a timing difference between the fourth clock and the fifth clock; and (step 650) making a ternary decision based on comparing the first digital word and the second digital word.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A fifty percent duty cycle detector comprising:
a single-ended-to-differential converter (S2D) configured to receive a first clock and output a second clock and a third clock that are complementary;
a controllable swap circuit configured to receive the second clock and the third clock and output a fourth clock and a fifth clock in accordance with a logical control signal;
a time-to-digital converter (TDC) configured to receive the fourth clock and the fifth clock and output a digital word; and a finite state machine (FSM) configured to receive the digital word and output the logical control signal and a ternary decision.

2. The fifty percent duty cycle detector of claim 1, wherein the digital word represents a timing difference between a rising edge of the fourth clock and a subsequent rising edge of the fifth clock.

3. The fifty percent duty cycle detector of claim 1, wherein the TDC is an all-digital circuit that comprises a plurality of inverters, logic gates, and flip-flops.

4. The fifty percent duty cycle detector of claim 1, wherein: the controllable swap circuit assigns the second clock and the third clock to be the fourth clock and the fifth clock, respectively, when the logical control signal is in a first state, and assigns the second clock and the third clock to be the fifth clock and the fourth clock, respectively, when the logical control signal is in a second state.

5. The fifty percent duty cycle detector of claim 4, wherein the FSM first sets the logical control signal to the first state and obtains a first value of the digital word, then sets the logical control signal to the second state and obtains a second value of the digital word, and then determines a value of the ternary decision in accordance with a comparison between the first value and the second value of the digital word.

6. A method of fifty percent duty cycle detection comprising:
receiving a first clock;
converting the first clock into a second clock and a third clock using a single-ended-to-differential converter (S2D);
assigning the second clock and the third clock to be a fourth clock and a fifth clock, respectively, and obtaining a first digital word by performing a first time-to-digital conversion that detects a timing difference between the fourth clock and the fifth clock;
assigning the third clock and the second clock to be the fourth clock and the fifth clock, respectively, and obtaining a second digital word by performing a second time-to-digital conversion that detects a timing difference between the fourth clock and the fifth clock; and making a ternary decision based on comparing the first digital word and the second digital word.

7. The method of fifty percent duty cycle detection of claim 6, wherein performing a first time-to-digital conversion and a second time-to-digital conversion comprises using a time-to-digital converter that is an all-digital circuit that comprises a plurality of inverters, logic gates, and flip-flops.

* * * * *